(12) United States Patent
Wu et al.

(10) Patent No.: US 6,554,002 B2
(45) Date of Patent: Apr. 29, 2003

(54) METHOD FOR REMOVING ETCHING RESIDUES

(75) Inventors: Chih-Ning Wu, Hsin-Chu (TW); Cheng-Yuan Tsai, Pei-Kang Chen (TW); Chan-Lon Yang, Taipei (TW)

(73) Assignee: United Microelectronics Corp. (TW)

( * ) Notice: Subject to any disclaimer, the term of this patent is extended or adjusted under 35 U.S.C. 154(b) by 119 days.

(21) Appl. No.: 09/789,349

(22) Filed: Feb. 21, 2001

(65) Prior Publication Data

US 2002/0113037 A1 Aug. 22, 2002

(51) Int. Cl.[7] .......................... H01L 21/302; B08B 6/00
(52) U.S. Cl. ................. 134/1.2; 134/1.3; 438/725; 438/714; 438/704; 438/734; 438/740; 438/744; 438/757; 438/750
(58) Field of Search ..................... 134/1.2, 1.3; 216/57, 216/105, 78; 438/734, 714, 740, 744, 750, 757, 704, 725

(56) References Cited

U.S. PATENT DOCUMENTS 6,177,347 B1 * 1/2001 Liu et al. ..................... 438/675
6,323,121 B1 * 11/2001 Liu et al. ..................... 438/633
6,380,096 B2 * 4/2002 Hung et al. ................. 438/723
6,417,114 B2 * 7/2002 Peyne et al. ................ 438/754

* cited by examiner

Primary Examiner—George Goudreau

(57) ABSTRACT

A method for removing fluorine-containing etching residues during dual damascene process comprises providing a dual damascene structure having a copper conductor structure therein, a cap layer formed on the copper conductor structure and the dual damascene structure, and a low dielectric constant dielectric layer on the cap layer. The low dielectric constant dielectric layer formed by spin-on polymer method has at least an opening above the copper conductor structure. The cap layer is etched by fluorine-containing plasma to expose the copper conductor structure. The dual damascene structure is cleaned with a solvent and then the fluorine-containing etching residues are removed by plasma sputtering treatment or baking, or by a combination of both. The addition of baking and plasma sputtering treatment can prevent poor adhesion between the subsequent metal diffusion barrier layer and the low dielectric constant dielectric layer.

4 Claims, 3 Drawing Sheets

METHOD FOR REMOVING ETCHING RESIDUES

BACKGROUND OF THE INVENTION

1. Field of the Invention

The present invention relates to a method for removing etching residues, and relates more particularly to a method for removing fluorine-containing etching residues that can result in poor adhesion between the barrier layer and the low-k dielectric layer.

2. Description of the Prior Art

Many highly integrated semiconductor circuits utilize multilevel wiring line structures for interconnecting regions within devices and for interconnecting one or more devices within the integrated circuits. In forming a second level wiring line in contact with the first level wiring lines or interconnect structures, a first level interconnect might be formed in contact with a doped region within the substrate of an integrated circuit device. Alternately, a first level interconnect might be formed to a polysilicon or metal wiring line that is in contact with one or more device structures in or on the substrate of the integrated circuit device. One or more interconnects are typically formed between the first level wiring line or interconnect and other portions of the integrated circuit device or to structures external to the integrated circuit device. This is accomplished, in part, through the second level of wiring lines.

The utility of copper material and low dielectric constant material are been developing in some new manufacturing processes for finding a resolution to the RC delay problem resulting from the decrease of devices size. One alternative to the conventional interconnect formation process is the so-called dual damascene process. Dual damascene processes are more immediately scaleable to smaller design rules and most dual damascene processes naturally produce a planarized final surface over the interconnect structure. Accordingly, a surface that is appropriate for further process steps can be obtained using the dual damascene process in fewer process is illustrated in FIG. 1. FIG. 1 is a cross-sectional diagram illustrating a Cu/low-k dual damascene structure. A copper conductor structure 130 is adjacent to a first low-k dielectric layer 110 and a cap layer 140 is formed thereon. An etched second low-k dielectric layer 120 with a pattern is on the cap layer 140.

Next, the exposed cap layer 140 is etched. However, the etching step is implemented by fluorine-contained plasmas, such as $CH_2F_2$—$O_2$—Ar plasma, and some fluorinated polymeric material is formed nearby during the etching process. Then the etching residues are removed during the post-etch cleaning process. In general, the etching residues are removed by use of a conventional amine-based inorganic solvent, such as APM cleaning ($NH_4OH/H_2O_2/H_2O$). However, it is difficult to remove the fluorinated polymeric material by such an amine-based inorganic solvent. The residual fluorinated polymeric material may result in poor adhesion between low-k dielectric layer and barrier metals in subsequent steps, and may further result in peeling problems. Accordingly, the fluorinated polymeric material needs to be absolutely removed during post-etch cleaning.

SUMMARY OF THE INVENTION

It is an object of the present invention to provide a method for completely removing polymeric material residues during post-etch cleaning. The addition of sputtering step in post-etch cleaning process can destroy the structure of the polymeric material residues.

It is another object of the present invention to provide a method for preventing poor adhesion of the barrier layer in via and trench devices. An etching residue is removed by the addition of a baking process in the post-etch cleaning process.

In the present invention, a method for removing fluorine-containing etching residues during dual damascene process comprises providing a damascene structure having a copper conductor structure therein, a cap layer formed on the copper conductor structure and the damascene structure, and a low dielectric constant dielectric layer on the cap layer. The low dielectric constant dielectric layer formed by spin-on polymer method has at least an opening above the copper conductor structure. The cap layer is etched by fluorine-containing plasma to expose the copper conductor structure. The damascene structure is cleaned with a solvent and then the fluorine-containing etching residues are removed by plasma sputtering treatment or baking, or combination of both. The addition of baking and plasma sputtering treatment can prevent poor adhesion between coming metal diffusion barrier layer and the low dielectric constant dielectric layer.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered and that species and types of substrate and dopant as well as other materials substitutions can be freely made without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a method for removing fluorine-containing etching residues during damascene process comprises providing a damascene structure having a copper conductor structure therein, a cap layer formed on the copper conductor structure and the damascene structure, and a low dielectric constant dielectric layer on the cap layer. The low dielectric constant dielectric layer formed by spin-on polymer method has at least an opening above the copper conductor structure. The cap layer is etched by fluorine-containing plasma to expose the copper conductor structure. The damascene structure is cleaned with a solvent and then the fluorine-containing etching residues are removed by plasma sputtering treatment or baking, or combination of both. The addition of baking and plasma sputtering treatment can prevent poor adhesion between subsequent metal diffusion barrier layer and the low dielectric constant dielectric layer.

Figure 1:
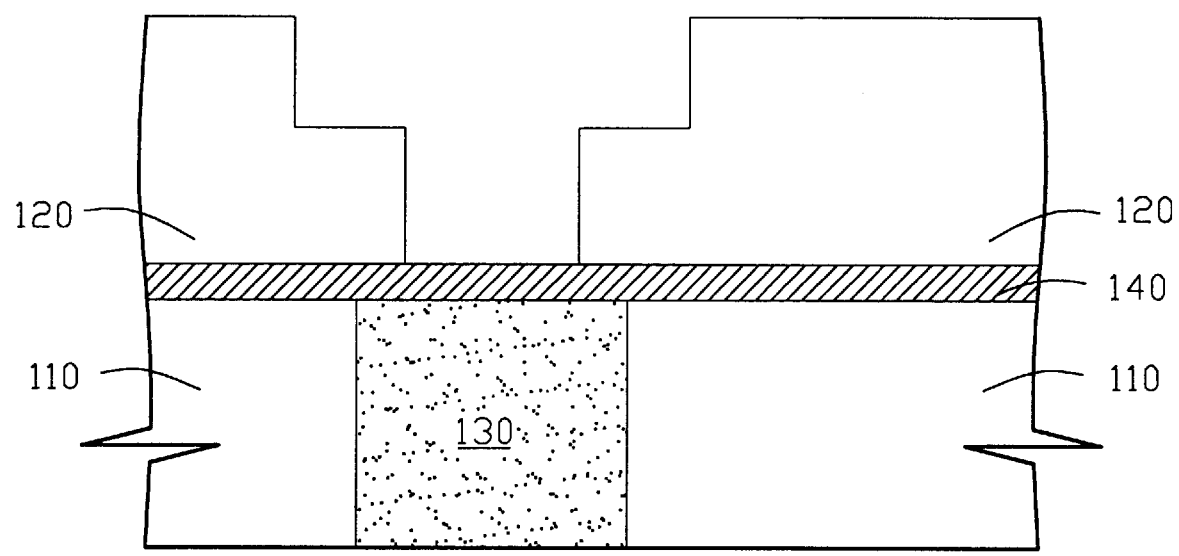
FIG. 1 is a cross-sectional drawing illustrating a dual damascene structure in accordance with the prior art.
Figure 2:
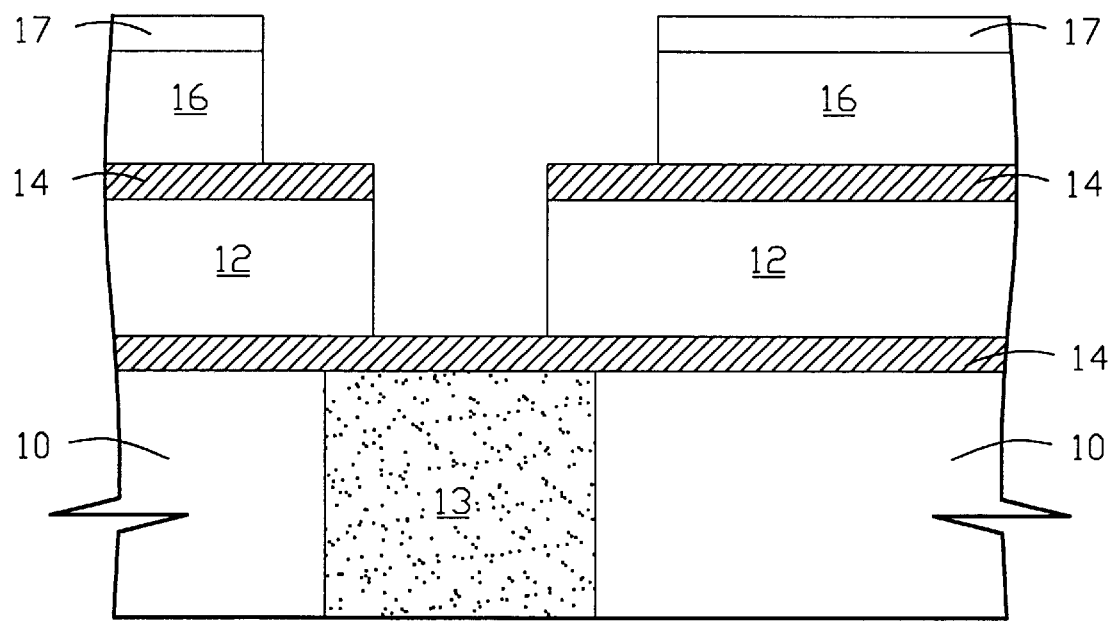
FIG. 2 is a cross-sectional drawing illustrating a dual damascene structure in accordance with the present invention.

Referring to FIG. 2, a semiconductor structure, such as a dual damascene structure, comprises a copper conductor structure 13, a first low K dielectric layer 10 and a cap layer 14. Moreover, the cap layer 14 is also between an etched second low K dielectric layer 12 and a third low K dielectric layer 16. A mask 17 is used for pattern definition of the etched third low K dielectric layer 16. Furthermore, all low K dielectric layers have dielectric constants smaller than 2.6, and are formed by a chemical vapor deposition or spin on method. Of course, the mask 17 is a hard mask when the third low K dielectric layer 16 is formed by the spin-on method, while it is a photoresist when the third low K dielectric layer 16 is applied by chemical vapor deposition.

As a key step of the present invention is to remove etching residues on the second, the third low k dielectric layer (14 and 16) and copper conductor structure 13 in a post-etch clean procedure. However, there are some disadvantages using the fluorine-containing plasma, such as $CH_2F_2$ and $C_2F_6$, as etching plasma because the fluorinated polymeric residues are formed. Those inorganic solvents in cleaning procedure cannot absolutely remove the fluorinated polymer (not shown). The fluorinated polymer etching residue may impede adhesion of coming formed metal diffusion barrier layer (not shown) at the sidewalls of the second or the third low k dielectric layer (14 and 16), and further result in peeling of the barrier layer. In the present invention, a combination of a baking process and sputtering treatment after inorganic solvent cleaning is applied on the dual damascene structure in the post-etch cleaning procedure. The main purpose of baking process is to remove the residue gases in the loose second and third low K dielectric layers (14 and 16). The wafer is placed into furnace with $N_2$ surroundings and at a temperature between about 350° C. to 400° C. Furthermore, the wafer is treated with Ar or $H_2$ plasma sputtering. The fluorinated polymer etching residues can be physically bombarded out by Ar sputtering treatment, or volatilized by $H_2$ plasma sputtering treatment that is reacted with the second or third low K dielectric layers.

Figure 3A:
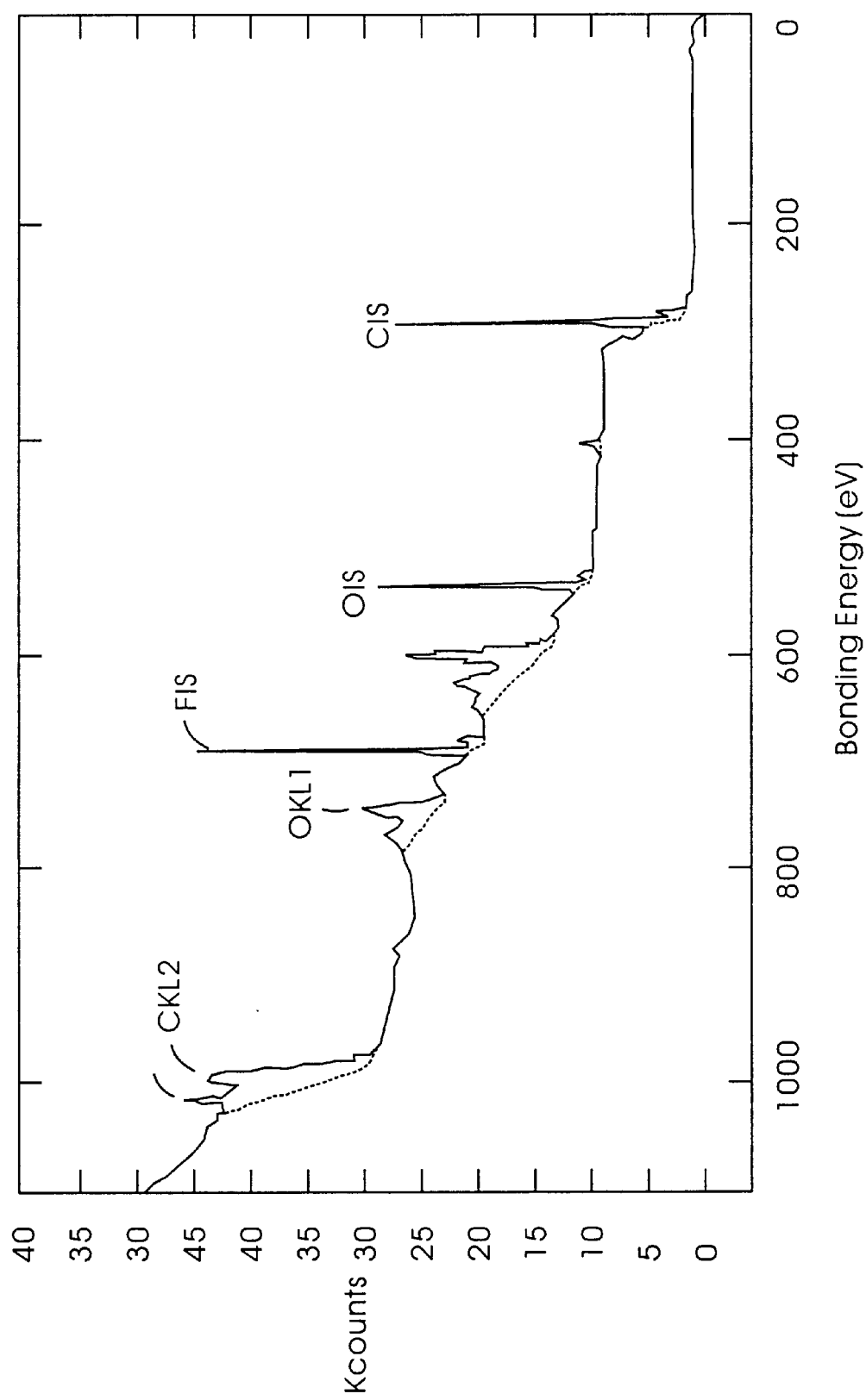
FIG. 3A is a XPS spectrum diagram illustrating Cu/spin-on low-k dual damascene structure after post-etch cleaning procedure in accordance with the prior art.
Figure 3B:
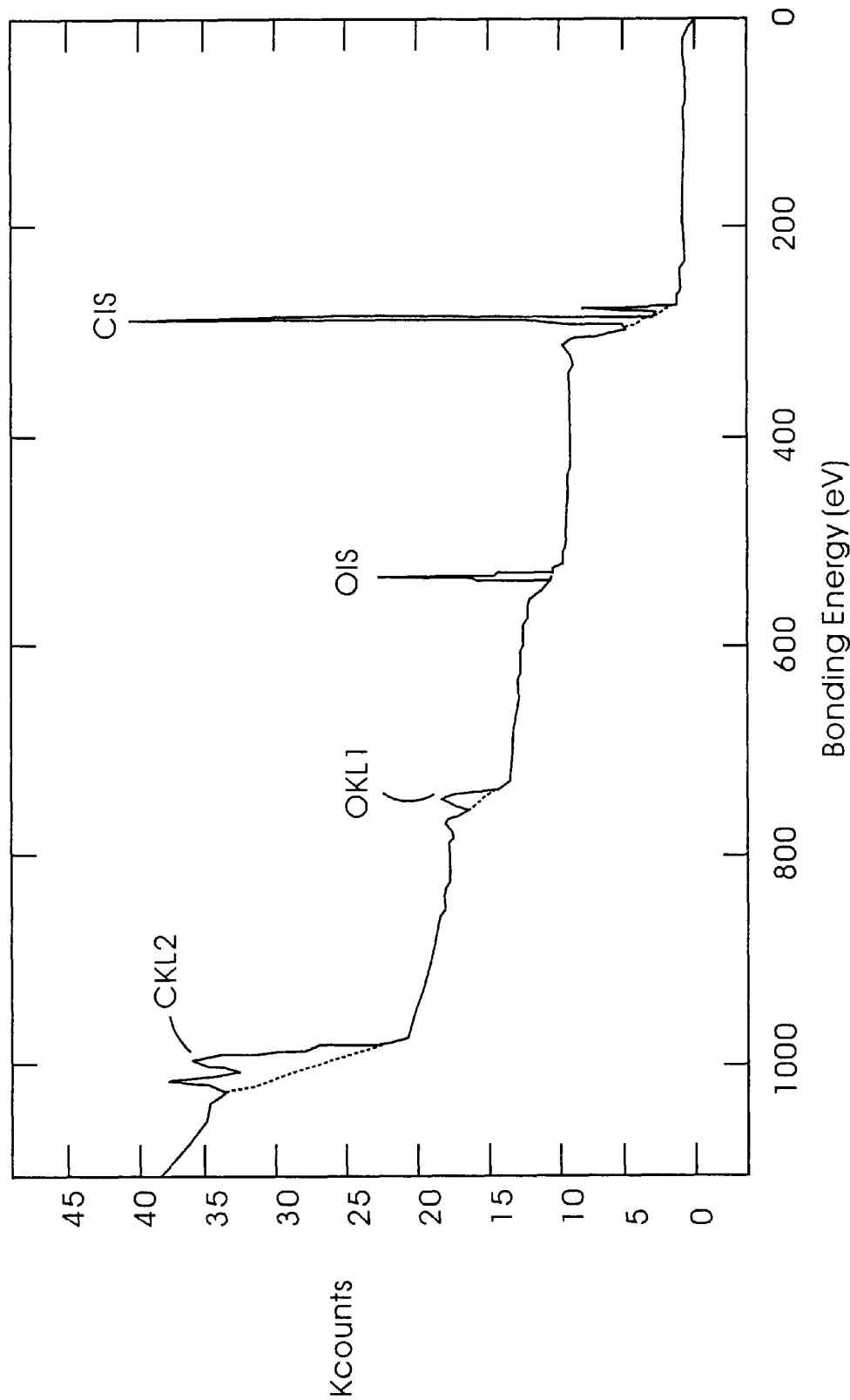
FIG. 3B is a XPS spectrum diagram illustrating Cu/spin-on low-k dual damascene structure after post-etch cleaning procedure in accordance with the present invention.

FIG. 3A illustrates a XPS spectrum of Cu/spin-on low-k dual damascene structure after application of the conventional post-etch amine-containing cleaning solvent. The fluorine signal is detected in XPS spectrum and may further result in poor adhesion of the second dielectric layer (low-k dielectric material) and a barrier layer. On the other hand, FIG. 3B is a XPS spectrum of Cu/spin-on low-k dual damascene structure after baking process and sputtering treatment of the present invention. The fluorine signal is not found in the XPS spectrum.

Although this invention is described relative to specific dielectric materials, conductive materials and apparatus for depositing and etching these materials, it is not limited to such materials and other materials and apparatuses for depositing the etching dielectric and conductive materials can be substituted as is well understood by those skilled in the microelectronics multi-layer interconnection art.

Further, although the embodiments of the present invention are directed to dual damascene on semiconductor devices, it also will be recognized by those skilled in multi-layer interconnection substrates art that the present invention can be used in fabricating those substrates packages for interconnect electronic systems. Such multilevel or multi-layer substrates uses organic insulating layers, such as polyimide, and conductive lines, such as aluminum. The dual damascene process of the present invention with a protective mask for via etching is well-suited for the manufacture of such devices.

What is claimed is:

1. A method for removing fluorine-contained etching residues during dual damascene process, said method comprising:

providing a dual damascene structure having a copper conductor structure therein and a cap layer formed on said copper conductor structure and said dual damascene structure, and a low dielectric constant dielectric layer on said cap layer, said low dielectric constant dielectric layer having at least an opening above said copper conductor structure;

etching said cap layer by fluorine-contained plasma to expose said copper conductor structure;

cleaning said dual damascene structure with a solvent;

baking said dual damascene structure; and removing said etching residues by plasma sputtering treatment.

2. The method according to claim 1, wherein said sputtering treatment is implemented with argon plasma.

3. A method according to claim 1, wherein said sputtering treatment is implemented with hydrogen plasma.

4. The method according to claim 1, wherein said baking step is implemented in environment of nitrogen gas.

* * * * *